United States Patent [19]

Vilard

[11] Patent Number: 5,282,039
[45] Date of Patent: Jan. 25, 1994

[54] VIDEO SIGNAL AMPLIFIER ARRANGEMENT FOR A TELEVISION DISPLAY TUBE

[75] Inventor: Philippe Vilard, Houilles, France

[73] Assignee: U.S. Philips Corporation, New York, N.Y.

[21] Appl. No.: 840,364

[22] Filed: Feb. 24, 1992

[30] Foreign Application Priority Data

Mar. 29, 1991 [FR] France ............... 91 03852

[51] Int. Cl.$^5$ .................. H04N 5/14; H04N 5/68
[52] U.S. Cl. .................... 358/184; 358/242; 330/258
[58] Field of Search ............. 358/184, 242, 243, 168; 330/258; 315/383

[56] References Cited

U.S. PATENT DOCUMENTS

| | | | |
|---|---|---|---|
| 4,035,840 | 7/1977 | Teuling ................ | 358/184 |
| 4,118,731 | 10/1978 | Hinn .................. | 358/65 |
| 4,197,558 | 4/1980 | Rutishauser .......... | 358/184 |
| 4,224,640 | 9/1980 | Hovens et al. ........ | 358/242 |
| 4,293,875 | 10/1981 | Katz .................. | 358/184 |
| 4,471,322 | 9/1984 | Yamaguchi et al. ..... | 330/267 |
| 4,727,336 | 2/1988 | Mark .................. | 358/184 |
| 4,999,586 | 3/1991 | Meyer et al. ......... | 358/184 |

Primary Examiner—Mark R. Powell
Assistant Examiner—John W. Miller
Attorney, Agent, or Firm—Edward W. Goodman

[57] ABSTRACT

An amplifier includes amplifier transistor (3) whose collector is connected to a load impedance (12) which is a current generator and includes a device for controlling the current as a function of the voltage level at the collector (20) of the amplifier transistor, which control acts in such a way that the current decreases when the voltage increases with a time constant which is of the order of the field retrace period. The amplifier transistor (3) is of the NPN type and the power supply is positive, while the current generator is a PNP transistor (7) whose base is connected to the collector of the amplifier transistor (3) via a resistor (4).

12 Claims, 1 Drawing Sheet

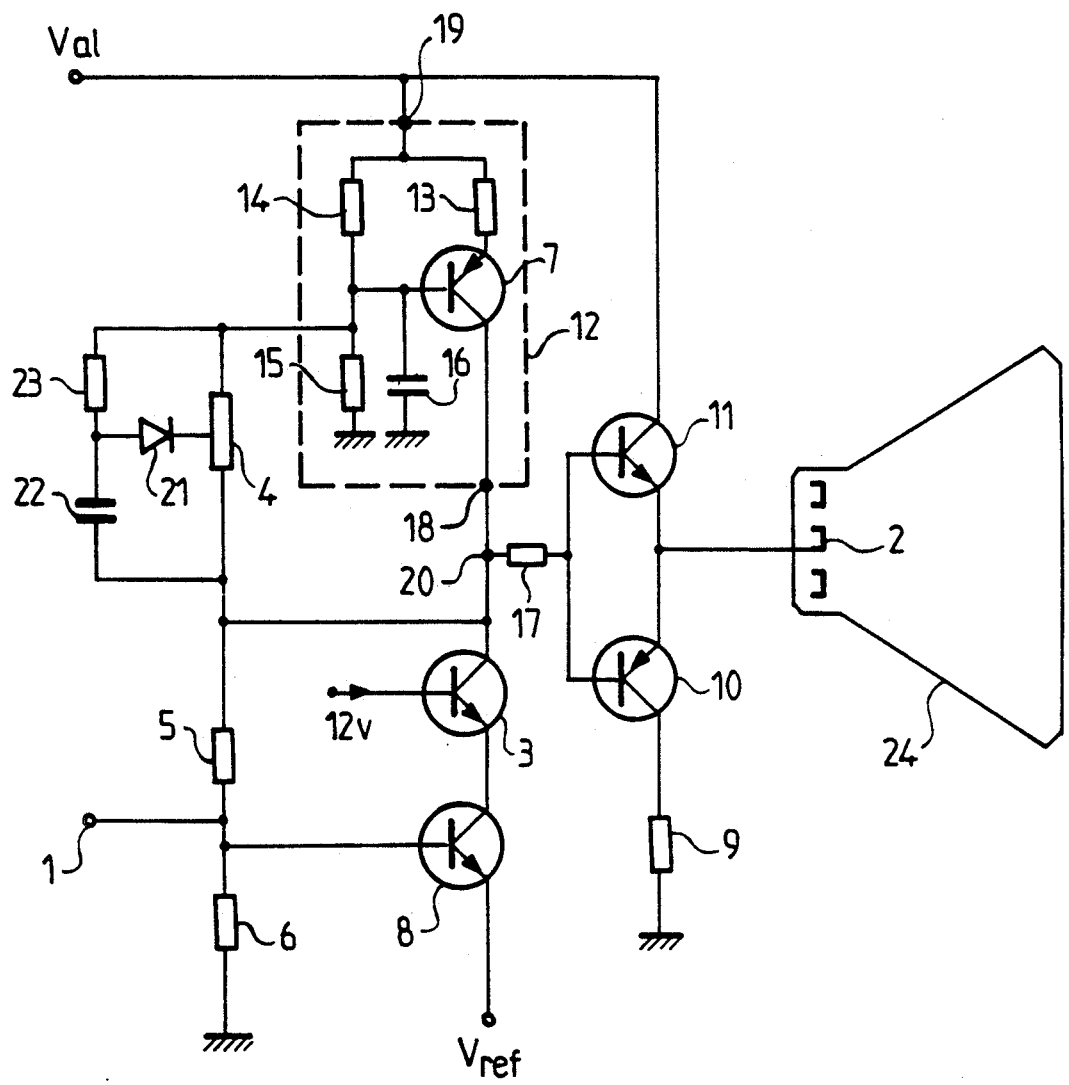

VIDEO SIGNAL AMPLIFIER ARRANGEMENT FOR A TELEVISION DISPLAY TUBE

BACKGROUND OF THE INVENTION

1. Field of the Invention

The invention relates to a video signal amplifier arrangment for a television display tube, comprising an amplifier transistor whose collector is coupled to a terminal of a load impedance, the other terminal of which is coupled to a power supply source, the output signal of the amplifier being taken from said collector which is coupled to a video control electrode of the display tube.

Such amplifier arrangements present the following problem: a low load impedance of the amplifier transistor will contribute to a considerable current in the transistor with a large power dissipation. If this load impedance has a high value, the amplifier will have an insufficient passband.

2. Description of the Related Art

This problem can be solved by substituting the load for an active element, for example a second amplifier transistor having a polarity which is opposed to that of the first. Such a solution using two complementary push-pull cascode arrangements is described, for example in the documents U.S. Pat. Nos. 4,727,336, and 4,035,840 or JP-A-63 26105.

Nevertheless, such a solution makes it difficult to realize the drive of the second amplifier transistor, because the use of a connection capacitance (documents U.S. Pat. No. 4,035,840 and JP-A-63 26105) necessitates a compromise as regards the transition frequency of the capacitive connection, and a drive transmitting the dc component will complicate the realization because of the dc offset between the bases of the two transistors (for example, the circuit described in document U.S. Pat. No. 4,727,336 has two power supplies for this reason: +55 V and −55 V).

SUMMARY OF THE INVENTION

It is an object of the invention to provide a simpler arrangement whose performance is superior to that of an arrangement having a passive load, and which provides the additional advantage that the power supply value can be decreased.

To this end, the arrangement according to the invention is characterized in that said load impedance is a current generator and in that it comprises a device for controlling said current as a function of the voltage level at the collector of the amplifier transistor, said control acting in such a way that said current decreases when said voltage increases, with a time constant which is larger than the largest period of the video signals.

Advantageously, the time constant is of the order of the field retrace period.

In a modification the ac component of the output signal is rectified and is partly applied to the device for controlling the current generator.

In a particular embodiment of the invention, in which the amplifier transistor is of the NPN type and the power supply is positive, said current generator is a PNP transistor whose emitter is coupled to the power supply, the collector is coupled to that of the amplifier transistor and the base is coupled to the output of the amplifier via a resistor, while means are provided for a bias setting of the base of said PNP transistor, which means include a grounded decoupling capacitor.

In a modification of this embodiment the ac component of the output signal is rectified and is partly applied to the bias setting of the current generator PNP transistor by means of a circuit comprising a capacitor which is coupled at one end to the collector of the amplifier transistor and at the other end to the anode of a signal diode whose cathode is coupled to a central tap of the resistor, the anode of the diode being also coupled to the base of the current generator PNP transistor via a resistor.

BRIEF DESCRIPTION OF THE DRAWING

These and other aspects of the invention will now be described in greater detail, by way of example, with reference to the accompanying drawing in which the sole FIGURE shows an arrangement according to the invention.

DESCRIPTION OF THE PREFERRED EMBODIMENT

The arrangement shown in the Figure has an input terminal 1 to which a video signal is applied which must be amplified so as to be applied to a video control electrode 2, for example a cathode, of a display tube 24.

The signal at the input terminal 1 is applied to the base of an NPN transistor 8 of the type BC548, arranged in a common emitter configuration, whose emitter is connected to a dc reference voltage source Vref and whose collector is connected to the emitter of an amplifier NPN transistor 3 of the type BF422 arranged in a common base configuration. The base of the transistor 3 is connected to a dc source of 12 Volts and its collector is connected to a terminal 18 of a load impedance 12, the other terminal 19 of which is connected to a power supply source Val. The assembly of the transistors 8 and 3 thus constitutes a cascode arrangement. The base of the transistor 8 is biassed by means of a negative feedback resistor 5 of 120 kOhms, which is connected to the collector of the transistor 3, and by a resistor 6 of 2.7 kOhms which is connected to ground.

The output signal of the amplifier is taken from the connection of the collector 20 of transistor 3 and transmitted to the electrode 2 of the display tube via a resistor 17 of 330 Ohms and a push-pull stage of complementary transistors 10 and 11 of the types BF423 and BF422, respectively, each arranged in an emitter-follower configuration, with which particularly the beam current of the display tube can be measured in a resistor 9 for controlling the cut-off or the white level, which aspects do not form part of the invention. The presence of this stage does not change much of the problem, because the input capacitance of the transistors 10, 11 is of the same order as the electrode capacitance of the display tube and the transistor 3 "sees" substantially the same impedance as in the case in which it would be directly connected to the electrode 2.

The load impedance 12 is a current generator and is principally constituted by a PNP transistor 7 of the type BF423 forming a current source. Its collector is connected to that of the amplifier transistor 3. The emitter of this PNP transistor 7 is connected to the power supply source Val via a resistor 13 of 2200 Ohms, which source provides a positive power supply of 150 to 170 Volts (200 Volts would be necessary with a simple resistive load).

The current generator transistor 7 is driven by a device for controlling the current. Means for the bias setting of the base of this transistor are constituted by a resistor 14 of 100 kOhms and a resistor 15 of 2.2 Mohms connecting the base of transistor 7 to the power supply and to ground, respectively, with a capacitor 16 of 10 nF which ensures that the base of the transistor is decoupled to ground. A resistor 4 of 430 kOhms connects the base of transistor 7 to the collector of transistor 3 (constituting the output 20 of the amplifier). It is evident that the voltage at the terminals of the resistor 4 decreases if the mean voltage at point 20 increases: less current is flowing and the transistor 7 thus also conveys less current. The control is thus active as a function of the voltage level at the collector of transistor 3 in such a way that said current decreases when said voltage increases. The control time constant is the product of the value of three parallel resistors 4, 14, 15 and the value of the capacitor 16. It is larger than the largest period of the video signals and is of the order of the field retrace period.

With a static (resistive) load, the dissipated power in the amplifier transistor is maximum when the output voltage is half the power supply voltage. With a load consisting of a fixed current source, the dissipated power in the amplifier transistor is maximum when the output voltage is closest to the power supply voltage. In both cases, for the voltage values at which the power is not maximum, the passband is reduced with respect to that which would be possible at the maximum power at which the transistor is capable of dissipating without any risk. In the arrangement according to the invention, the current control can be adjusted in such a way that the power dissipated in the amplifier transistor is constant, irrespective of the mean voltage at the output and consequently there is always an optimum passband.

It is also possible to vary the current of the current generator as a function of the amplitude of the ac voltage of the output signal. This can be realized by rectifying this voltage and by partly applying it to the bias setting of the current generator PNP transistor 7, for example by means of a circuit comprising a capacitor 22 of several pF connected at one end to the collector 20 of the amplifier transistor and at the other end to the anode of a signal diode 21 of the type 1N4148 whose cathode is connected to a central tap of the resistor 4, the anode of the diode 21 being also connected to the base of the current generator PNP transistor 7 via a resistor 23. The position of the central tap of the resistor 4 can easily be determined by experiment, in accordance with the desired effect. However, this modification of the rectifier circuit constituted by the components 21-23 is of minor interest.

The power supply voltage may be further decreased by means of special provisions. For example, let it be assumed that the black level is obtained for a grid cathode voltage of 150 Volts. By connecting the grid of the display tube to a negative voltage source, for example, a source of −30 Volts which may already be present in the television receiver, an absolute cathode voltage is obtained for the black level, which voltage is only 120 Volts and the power supply voltage of the video amplifier can be decreased to 150 Volts, thus benefiting from existing power supply voltages at this level.

With the components indicated in the embodiment described above, but with a fixed resistive load for the transistor 3, prior-art embodiments necessitated the use of two transistors 3 of the type BF422 in parallel, together with cooling members referred to as "radiators" in order to sustain the power required for obtaining the passband; with the arrangement according to the invention and particularly due to the reduction of the power supply voltage, a single transistor is sufficient.

The numerical values or the semiconductor references indicated in the description have only a documentary value and need not be considered as necessary values, although they enable the Applicant to realize a satisfactory arrangement. For example, the current generator 12 may be realize in a different manner, because controllable current generator circuits are commercially available in the form of integrated circuits.

I claim:

1. A video signal amplifier arrangement for a television display tube, comprising an amplifier transistor having a collector coupled to a terminal of a load impedance, the other terminal of said load impedance being coupled to a power supply source, an output signal of the amplifier transistor being taken from said collector which is coupled to a video control electrode of the display tube, characterized in that said load impedance is a current generator which comprises a device for controlling a current as a function of a voltage level at the collector of the amplifier transistor, said device acting in such a way that said current decreases when said voltage level increases with a time constant which is larger than the largest period of the video signals.

2. A video signal amplifier arrangement as claimed in claim 1, characterized in that the time constant is of an order of a field retrace period.

3. An arrangement as claimed in claim 2, characterized in that an ac component of the output signal is rectified and is partly applied to the device for controlling the current generator.

4. An arrangement as claimed in claim 3, in which the amplifier transistor is of an NPN type and the power supply is positive, characterized in that said current generator is a PNP transistor having an emitter coupled to the power supply, a collector coupled to the collector of the amplifier transistor, and a base coupled to the output of the amplifier transistor via a resistor, while means are provided for a bias setting of the base of said PNP transistor, said means including a grounded decoupling capacitor coupled to the base of said PNP transistor.

5. An arrangement as claimed in claim 4, characterized in that the ac component of the output signal is rectified and is partly applied to the bias setting of the current generator PNP transistor by means of a circuit comprising a capacitor which is coupled at one end to the collector of the amplifier transistor and at the other end to an anode of a signal diode having a cathode coupled to a central tap of the resistor, the anode of the diode being also coupled to the base of the current generator PNP transistor via a further resistor.

6. An arrangement as claimed in claim 2, in which the amplifier transistor is of an NPN type and the power supply is positive, characterized in that said current generator is a PNP transistor having an emitter coupled to the power supply, a collector coupled to the collector of the amplifier transistor, and a base coupled to the output of the amplifier via a resistor, while means are provided for a bias setting of the base of said PNP transistor, said means including a grounded decoupling capacitor coupled to the base of said PNP transistor.

7. An arrangement as claimed in claim 6, characterized in that an ac component of the output signal is rectified and is partly applied to the bias setting of the current generator PNP transistor by means of a circuit comprising a capacitor which is coupled at one end to the collector of the amplifier transistor and at the other end to an anode of a signal diode have a cathode coupled to a central tap of the resistor, the anode of the diode being also coupled to the base of the current generator PNP transistor via a further resistor.

8. An arrangement as claimed in claim 1 characterized in that an ac component of the output signal is rectified and is partly applied to the device for controlling the current generator.

9. An arrangement as claimed in claim 8, in which the amplifier transistor is of an NPN type and the power supply is positive, characterized in that said current generator is a PNP transistor having an emitter coupled to the power supply, a collector coupled to the collector of the amplifier transistor, and a base is coupled to the output of the amplifier transistor via a resistor, while means are provided for a bias setting of the base of said PNP transistor, said means including a grounded decoupling capacitor coupled to the base of said PNP transistor.

10. An arrangement as claimed in claim 9, characterized in that the ac component of the output signal is rectified and is partly applied to the bias setting of the current generator PNP transistor by means of a circuit comprising a capacitor which is coupled at one end to the collector of the amplifier transistor and at the other end to an anode of a signal diode having a cathode coupled to a central tap of the resistor, the anode of the diode being also coupled to the base of the current generator PNP transistor via a further resistor.

11. An arrangement as claimed in claim 1, in which the amplifier transistor is of an NPN type and the power supply is positive, characterized in that said current generator is a PNP transistor having an emitter coupled to the power supply, a collector coupled to the collector of the amplifier transistor, and a base coupled to the output of the amplifier transistor via a resistor, while means are provided for a bias setting of the base of said PNP transistor, said means including a grounded decoupling capacitor coupled to the base of said PNP transistor.

12. An arrangement as claimed in claim 4, characterized in that an ac component of the output signal is rectified and is partly applied to the bias setting of the current generator PNP transistor by means of a circuit comprising a capacitor which is coupled at one end to the collector of the amplifier transistor and at the other end to an anode of a signal diode having cathode coupled to a central tap of the resistor, the anode of the diode being also coupled to the base of the current generator PNP transistor via a further resistor.

* * * * *